United States Patent
Lee et al.

(10) Patent No.: US 8,508,399 B2
(45) Date of Patent: Aug. 13, 2013

(54) SUCCESSIVE APPROXIMATION ANALOG TO DIGITAL CONVERTER AND METHOD OF ANALOG TO DIGITAL CONVERSION

(75) Inventors: Jung-Ho Lee, Gunpo-si (KR); Sung-Sang Lim, Suwon-si (KR); Yong-Woo Kim, Seoul (KR); Michael Choi, Seoul (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 126 days.

(21) Appl. No.: 13/163,872

(22) Filed: Jun. 20, 2011

(65) Prior Publication Data

US 2012/0007758 A1    Jan. 12, 2012

(30) Foreign Application Priority Data

Jul. 12, 2010  (KR) .................. 10-2010-0067034

(51) Int. Cl.
  *H03M 1/34*  (2006.01)
(52) U.S. Cl.
  USPC .......................................... 341/163; 341/155
(58) Field of Classification Search
  USPC .................. 341/155, 144, 158, 163, 172, 159
  See application file for complete search history.

(56) References Cited

U.S. PATENT DOCUMENTS

| | | | |
|---|---|---|---|
| 5,633,641 A | 5/1997 | Coleman, Jr. | |
| 6,674,386 B2 | 1/2004 | Carreau et al. | |
| 6,701,340 B1 | 3/2004 | Gorecki et al. | |
| 7,015,841 B2 * | 3/2006 | Yoshida et al. | 341/120 |
| 7,205,921 B1 * | 4/2007 | Savla | 341/155 |
| 7,265,704 B1 * | 9/2007 | Shakya | 341/162 |
| 7,312,737 B2 * | 12/2007 | Jungerman et al. | 341/141 |
| 7,671,777 B2 * | 3/2010 | Yamada et al. | 341/165 |
| 7,933,361 B2 * | 4/2011 | Huang et al. | 375/316 |
| 7,986,257 B2 * | 7/2011 | Yoshioka | 341/155 |
| 8,120,520 B2 * | 2/2012 | Jeong et al. | 341/163 |
| 2002/0003487 A1 * | 1/2002 | Harada et al. | 341/163 |

FOREIGN PATENT DOCUMENTS

| | | |
|---|---|---|
| JP | 07-231256 | 8/1995 |
| JP | 07-273652 | 10/1995 |
| JP | 11-055120 | 2/1999 |
| JP | 2007-013646 | 1/2007 |

\* cited by examiner

*Primary Examiner* — Peguy Jean Pierre
(74) *Attorney, Agent, or Firm* — F. Chau & Associates, LLC

(57) ABSTRACT

An analog to digital converter includes a digital to analog converting circuit, a comparator and a signal processing circuit. The digital to analog converting circuit samples and holds an analog input signal, and converts digital output data to an analog signal to generate a hold voltage signal. The comparator compares the hold voltage signal with a reference voltage signal in response to a rising edge and a falling edge of a clock signal to generate a comparison output voltage signal. The signal processing circuit performs successive approximation based on the comparison output voltage signal to generate the digital output data.

18 Claims, 9 Drawing Sheets

SUCCESSIVE APPROXIMATION ANALOG TO DIGITAL CONVERTER AND METHOD OF ANALOG TO DIGITAL CONVERSION

CROSS-REFERENCE TO RELATED APPLICATION

This application claims priority under 35 U.S.C. §119 to Korean Patent Application No. 10-2010-0067034 filed on Jul. 12, 2010, the disclosure of which is incorporated by reference in its entirety herein.

BACKGROUND

1. Technical Field

Embodiments of the inventive concept relate to an analog to digital converter, and more particularly, to an analog to digital converter performing analog to digital conversion using successive approximation and a method of analog to digital conversion.

2. Discussion of Related Art

An analog to digital converter (abbreviated ADC, A/D or A to D) is an electronic device that converts a continuous quantity to a discrete time digital representation. Analog to digital converters may convert input analog voltages or currents to digital codes or numbers. The numbers may be proportional to the magnitude of the voltage levels of the input analog signals. The resolution of the converter indicates the number of discrete values it can produce over the range of analog values. When the values are stored electronically in a binary form, the resolution is expressed in bits. Accordingly, the number of discrete values available, or "levels", is usually a power of two. For example, an ADC with a resolution of 8 bits can encode an analog input to one of 256 different levels, since $2^8=256$.

A successive approximation ADC is a type of analog to digital converter that converts a continuous analog waveform into a discrete digital representation via a binary search through all possible quantization levels before finally converging upon a digital output for each conversion.

SUMMARY

At least one embodiment of the inventive concept may provide an analog to digital converter that performs analog to digital conversion using successive-approximation with a high data processing speed. At least one embodiment of the inventive concept may provide a semiconductor device including the analog to digital converter. At least one embodiment of the inventive concept may provide a method of performing analog to digital conversion on an analog signal using successive-approximation with a high data processing speed.

According to an exemplary embodiment of the inventive concept, an analog to digital converter includes a digital to analog converting circuit, a comparator, and a signal processing circuit. The digital to analog converting circuit samples and holds an analog input signal, and converts digital output data to an analog signal to generate a hold voltage signal (VHOLD). The comparator compares the hold voltage signal with a reference voltage signal in response to a rising edge and a falling edge of a clock signal to generate a comparison output voltage signal. The signal processing circuit performs successive approximation based on the comparison output voltage signal to generate the digital output data.

In an alternate embodiment, the comparator compares two hold voltage signals instead of the hold voltage signal and the reference voltage signal in response to a rising edge and a falling edge of a clock signal to generate the comparison output voltage signal.

In at least one embodiment of the inventive concept, the comparator is made up of a first comparator and a second comparator. The first comparator may compare the hold voltage signal with the reference voltage signal in response to a first clock signal to generate a first comparison output voltage signal. The second comparator may compare the hold voltage signal with the reference voltage signal in response to a second clock signal having a phase opposite to a phase of the first clock signal to generate a second comparison output voltage signal.

In at least one embodiment of the inventive concept, the comparison output voltage signal may be a signal in which the first comparison output voltage signal and the second comparison output voltage signal are added alternately.

In at least one embodiment of the inventive concept, the signal processing circuit may include a demultiplexer and a plurality of SR latches. The demultiplexer may perform demultiplexing on the comparison output voltage signal in response to a selecting signal. The plurality of SR latches may latch and output one of a plurality of output signals of the demultiplexer in response to each bit of a conversion control signal.

In at least one embodiment of the inventive concept, the analog to digital converter may further include an output register that stores the digital output data, and outputs the digital output data when the signal processing circuit determines that the data should be output.

In at least one embodiment of the inventive concept, the analog to digital converter may further include a timing circuit that generates a conversion control signal based on the clock signal and a conversion start signal, and provides the conversion control signal to the signal processing circuit.

In at least one embodiment of the inventive concept, the digital to analog converting circuit may be a binary-weighted-capacitor-type digital to analog converting circuit.

In at least one embodiment of the inventive concept, the analog to digital converter may be a synchronous analog to digital converter. In at least one embodiment of the inventive concept, the analog to digital converter may be an asynchronous analog to digital converter.

According to an exemplary embodiment of the inventive concept, an analog to digital converter includes a digital to analog converting circuit, a preamplifier, a comparator and a signal processing circuit. The digital to analog converting circuit samples and holds an analog input signal, and converts digital output data to an analog signal to generate a hold voltage signal (VHOLD). The preamplifier amplifies a difference between the hold voltage signal and a reference voltage signal. The comparator compares differential output voltage signals of the preamplifier with each other in response to a rising edge and a falling edge of a clock signal to generate a comparison output voltage signal. The signal processing circuit performs successive approximation based on the comparison output voltage signal to generate the digital output data.

In at least one embodiment of the inventive concept, the comparator may include a first comparator and a second comparator. The first comparator may compare the differential output voltage signals of the preamplifier with each other in response to a first clock signal to generate a first comparison output voltage signal. The second comparator may compare the differential output voltage signals of the preamplifier with each other in response to a second clock signal having a phase opposite to a phase of the first clock signal to generate a second comparison output voltage signal.

In at least one embodiment of the inventive concept, the preamplifier may include a first preamplifier and a second preamplifier. The first preamplifier and the second preamplifier may amplify a difference between the hold voltage signal and a reference voltage signal.

The first comparator may compare the differential output voltage signals of the first preamplifier with each other in response to a first clock signal to generate a first comparison output voltage signal. The second comparator may compare the differential output voltage signals of the second preamplifier with each other in response to a second clock signal having a phase opposite to a phase of the first clock signal to generate a second comparison output voltage signal.

In at least one embodiment of the inventive concept, the preamplifier may decrease an offset voltage of the comparator. In at least one embodiment of the inventive concept, the preamplifier may reduce noise of an output terminal of the digital to analog converting circuit.

According to an exemplary embodiment of the inventive concept, an analog to digital converter includes a digital to analog converting circuit configured to generate a hold voltage signal based on an analog input signal and digital output data, a first comparator configured to compare the hold voltage signal with a reference voltage signal in response to a first clock signal to generate a first comparison output voltage signal, a second comparator configured to compare the hold voltage signal with the reference voltage in response to a second clock opposite in phase to the first clock signal to generate a second comparison signal, and a signal processing circuit configured to perform successive approximation based on a comparison output voltage signal output by the comparator to generate the digital output data. The comparison output voltage signal is based on both the first and second comparison output voltage signals.

In at least one embodiment of the inventive concept, the first comparison output signal may be enabled in response to a falling edge of the first clock signal and disabled in response to a rising edge of the first clock signal, and the second comparison output signal may be enabled in response to a falling edge of the second clock signal and disabled in response to a rising edge of the second clock signal. The comparison output voltage signal may sequentially include a part of the first comparison output voltage and a part of the second comparison output voltage, where the part of the first comparison output voltage is from a first time after a rising edge of a pulse of the first clock signal to a second time before a rising edge of a sequential subsequent pulse of the first clock signal, and where the part of the second comparison output voltage is from the second time to a third time after the rising edge of the subsequent pulse.

In at least one embodiment of the inventive concept, the signal processing circuit may include a demultiplexer configured to perform demultiplexing on the comparison output voltage signal in response to a selecting signal to generate a plurality of demultiplexed signals, and a plurality of SR latches configured to latch a corresponding one of the demultiplexed signals in response to a conversion control signal, where each SR latch receives a corresponding one bit of the conversion control signal. A first bit of the conversion control signal may be enabled while a first pulse of the first clock signal is enabled, and a second bit of the conversion control signal sequentially subsequent to the first bit may be enabled while a second pulse of the first clock signal sequentially subsequent to the first pulse is disabled.

BRIEF DESCRIPTION OF THE DRAWINGS

Exemplary embodiments of the inventive concept are described in further detail below with reference to the accompanying drawings in which like reference characters may refer to the same parts throughout the different views. The drawings are not necessarily to scale. In the drawings.

DETAILED DESCRIPTION

Figure 1:
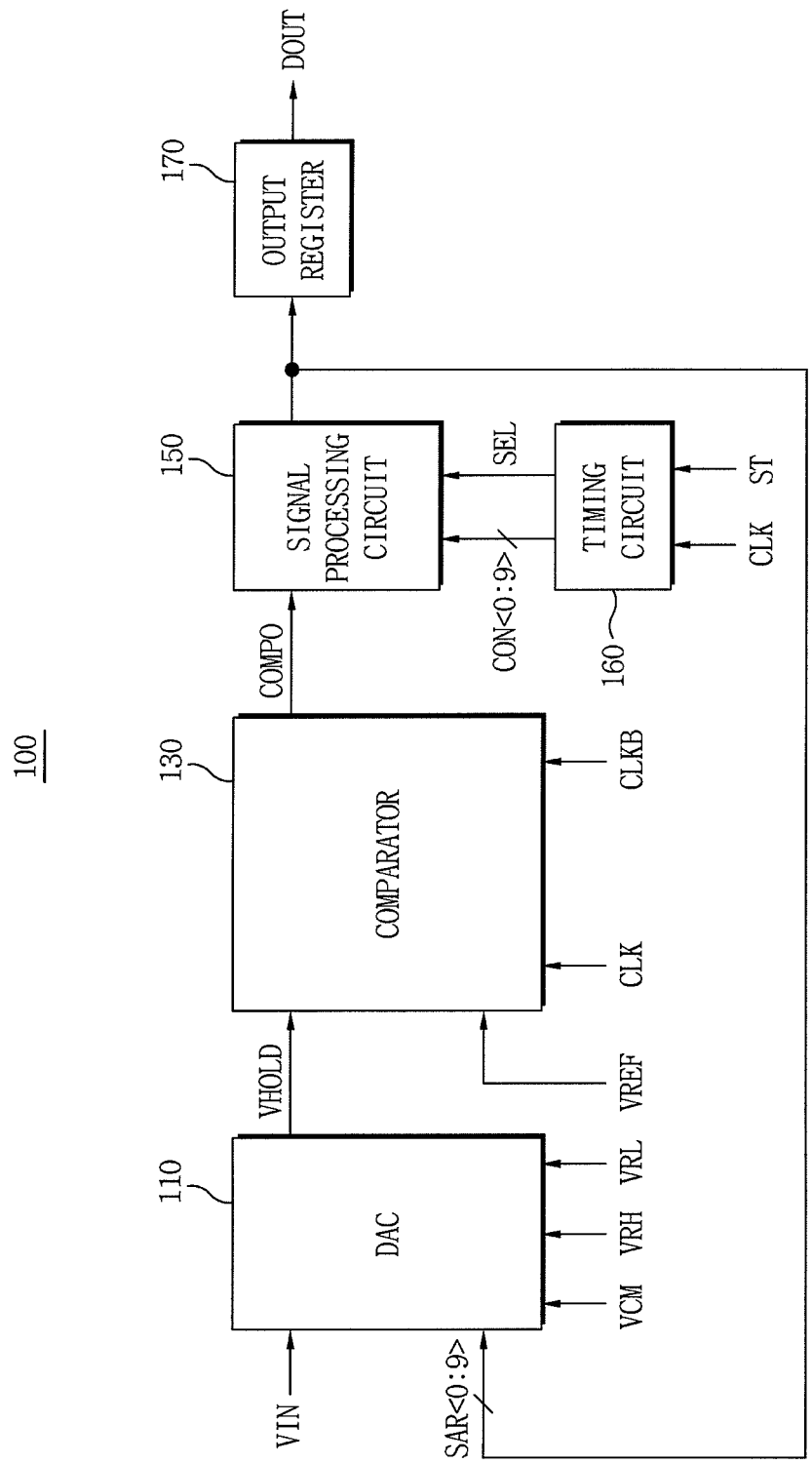
FIG. 1 is a block diagram illustrating an analog to digital converter in accordance with an exemplary embodiment of the inventive concept.

The present invention concept will now be described more fully with reference to the accompanying drawings in which some exemplary embodiments are shown. The inventive concept may, however, be embodied in different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled with" another element or layer, it can be directly on, connected or coupled to the other element or layer or intervening elements or layers may be present. Like numerals refer to like elements throughout.

FIG. 1 is a block diagram illustrating an analog to digital converter 100 in accordance with an exemplary embodiment of the inventive concept. Referring to FIG. 1, the analog to digital converter 100 includes a digital to analog converting circuit 110, a comparator 130 and a signal processing circuit 150.

The digital to analog converting circuit 110 samples and holds an analog input signal VIN, and converts digital output data SAR<0:9> to an analog signal to generate a hold voltage signal VHOLD. The comparator 130 may compare the hold voltage signal VHOLD with a reference voltage signal VREF in response to a rising edge and falling edge of a clock signal CLK to generate a comparison output voltage signal COMPO. Alternately, the comparator 130 may compare two hold voltage signals with each other in response to the rising edge and the falling edge of the clock signal CLK to generate the comparison output voltage signal COMPO. The signal processing circuit 150 performs successive approximation based on the comparison output voltage signal COMPO to generate the digital output data SAR<0:9>.

The analog to digital converter 100 may include a timing circuit 160 and an output register 170. The timing circuit 160 generates a conversion control signal CON<0:9> based on the clock signal CLK and a conversion start signal ST, and provides the conversion control signal CON<0:9> to the signal processing circuit 150. The output register 170 stores the digital output data SAR<0:9>, and outputs the digital output data SAR<0:9> as output data when data is determined by the signal processing circuit 150.

In FIG. 1, the analog to digital converter 100 generating 10 bits of digital output data SAR<0:9> and 10 bits of a conversion control signal CON<0:9> is used as an example. For example, embodiments of the inventive concept are not limited to data of any particularly size.

The analog to digital converter 100 of FIG. 1 uses a successive-approximation technique for conversion. The principle of the successive-approximation technique is as follows.

Each bit of a digital code representing a sampled value of an analog signal is determined through a single iteration starting from a most significant bit (MSB). The MSB is set to a specific logic value, for example 1, and the next bit is set to the other logic value, for example 1. The resulting number is converted to an intermediate analog signal. When the sampled value of an analog signal has a voltage level lower than the intermediate analog value, the MSB of the digital code is determined to be "0". On the contrary, when the sampled value of an analog signal has a voltage level higher than the intermediate analog value, the MSB of the digital code is determined to be "1". The next significant bit may be set to "1", and the next bit may be set to "0". The number determined in this way is used as a new intermediate analog signal. The new intermediate analog signal is compared with a sampled value of an analog signal to determine a next significant bit of a digital code corresponding to the new intermediate analog signal. This approximation operation is continued until all bits of the digital code are determined.

Figure 2:
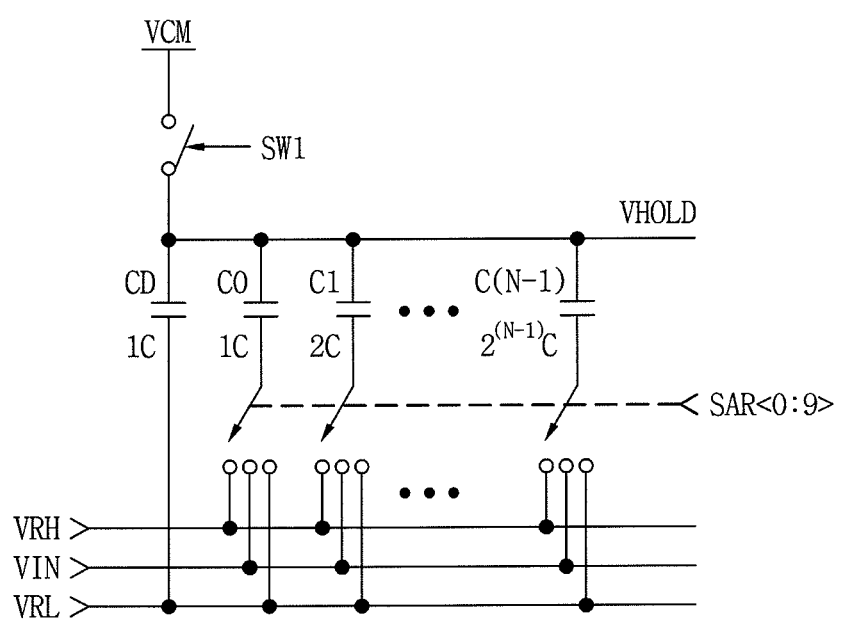
FIG. 2 is a circuit diagram illustrating an example of a digital to analog converting circuit included in the analog to digital converter of FIG. 1.

FIG. 2 is a circuit diagram illustrating an example of a digital to analog converting circuit 110 included in the analog to digital converter 100 of FIG. 1. The digital to analog converting circuit 110 shown in FIG. 2 is a binary-weighted-capacitor-type digital to analog converting circuit.

Referring to FIG. 2, the digital to analog converting circuit 110 may include capacitors CD, C0~C(N−1), and switches serially connected to the capacitors CD, C0~C(N−1). Each of the switches connects the capacitors C0~C(N−1) to one of an analog input signal VIN, a first reference voltage VRH and a second reference voltage VRL in response to each bit of the digital output data SAR<0:9>. The first reference voltage VRH may be a power supply voltage (VDD), and the second reference voltage VRL may be ground. When the analog input signal VIN is input, a switch control signal SW1 is enabled and the capacitor CD is connected to a third reference voltage VCM. The third reference voltage VCM may be half of the power supply voltage. As shown in FIG. 2, the capacitances of each of the capacitors C0~C(N−1) may be double that of a prior capacitor. The voltage level of the hold voltage signal VHOLD is proportional to a value of the digital output data SAR<0:9>. The digital to analog converting circuit 110 may convert a digital signal to an analog signal.

Figure 3:
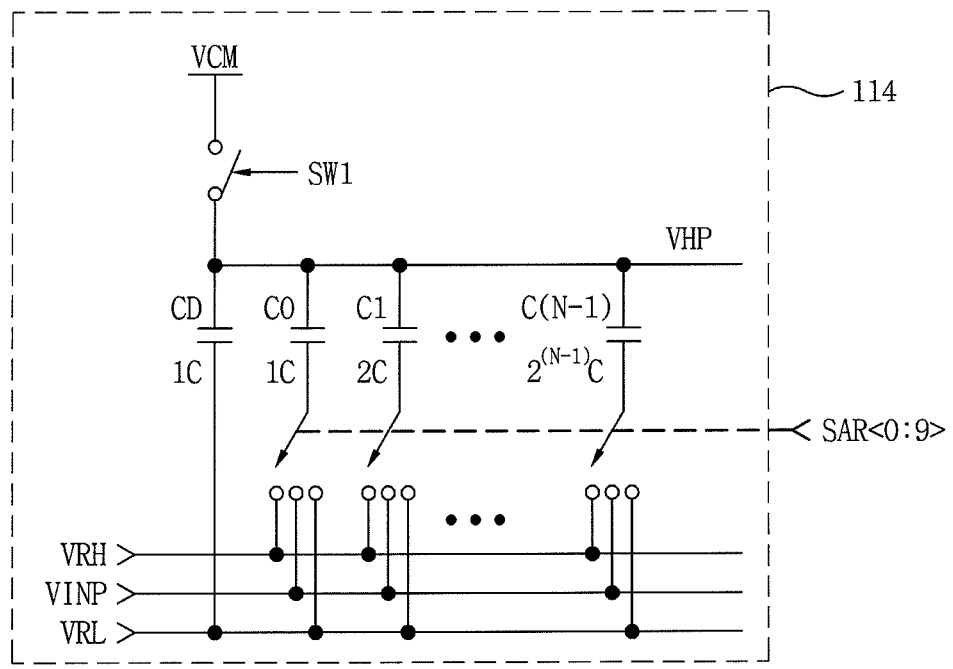
FIG. 3 is a circuit diagram illustrating an example of a digital to analog converting circuit included in the analog to digital converter of FIG. 1.
Figure 3:
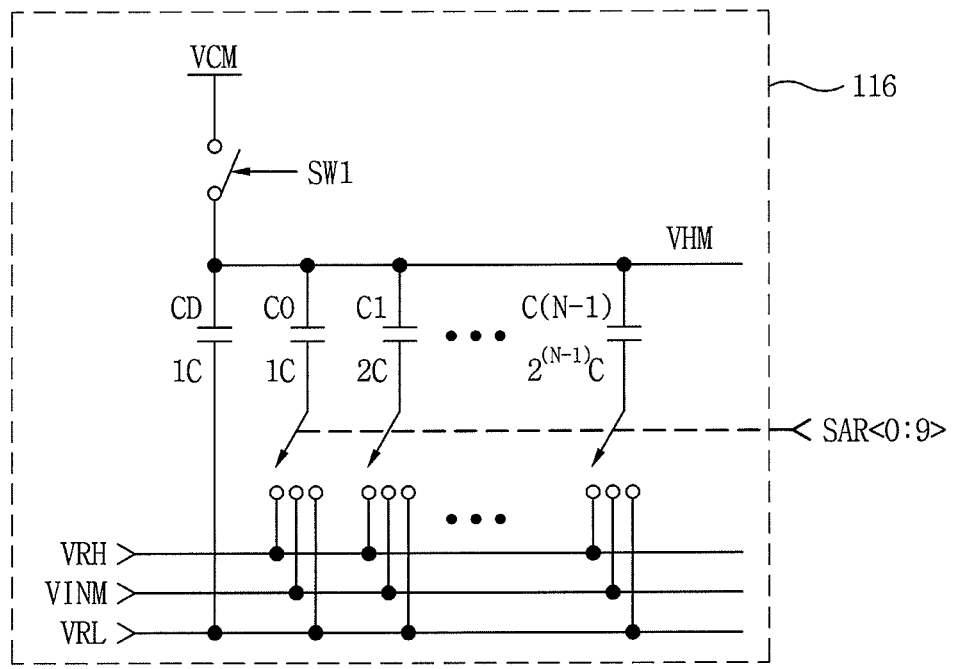

FIG. 3 is a circuit diagram illustrating an example of a digital to analog converting circuit 110 included in the analog to digital converter 100 of FIG. 1. The digital to analog converting circuit 110a shown in FIG. 3 includes a first digital to analog converting circuit 114 and a second digital to analog converting circuit 116, which are each similar to the digital to analog converting circuit 110 shown in FIG. 2. The converting circuits 114 and 116 generate differential signals VHP and VHM, respectively. When the digital to analog converting circuit 110a shown in FIG. 3 is employed, the comparator 130 included in the analog to digital converter 100 may amplify the differential signals VHP and VHM. The analog to digital converter 100 may have a high resolution when the digital to analog converting circuit 110a of FIG. 3 is employed in the analog to digital converter 100.

In FIGS. 2 and 3, a binary-weighted-capacitor-type digital to analog converting circuit is shown, but the analog to digital converter 100 may include a ladder-capacitor-type digital to analog converting circuit or a split-capacitor-type digital to analog converting circuit.

Figure 4:
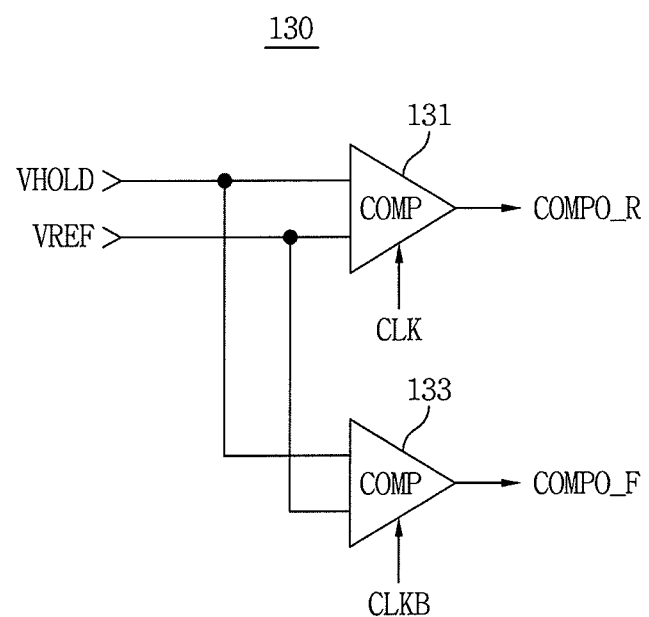
FIG. 4 is a circuit diagram illustrating a comparator included in the analog to digital converter of FIG. 1 in accordance with an exemplary embodiment of the inventive concept.
Figure 5:
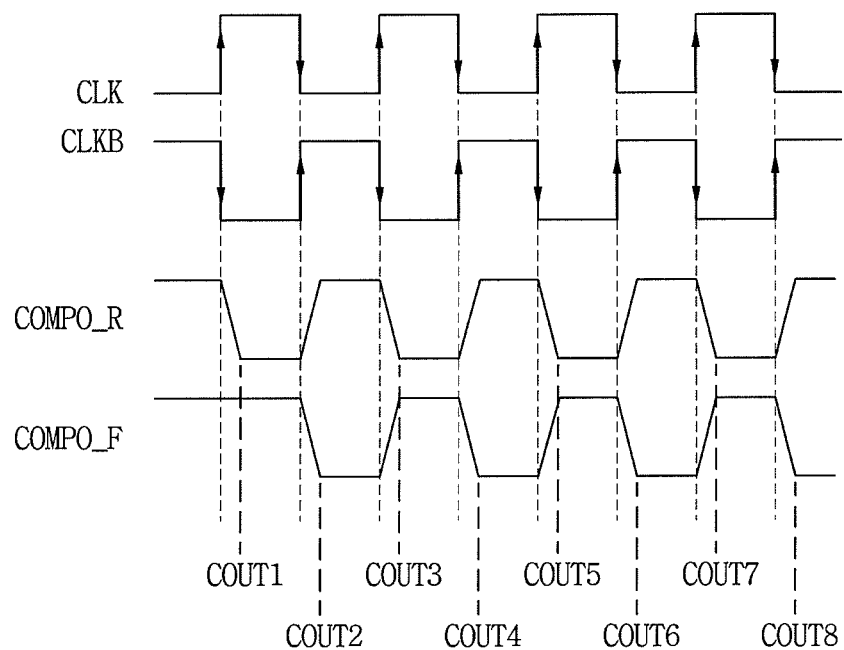
FIG. 5 is a timing diagram illustrating an exemplary operation of the comparator of FIG. 4.

FIG. 4 is a circuit diagram illustrating a comparator 130 included in the analog to digital converter 100 of FIG. 1 in accordance with an exemplary embodiment of the inventive concept. FIG. 5 is a timing diagram illustrating an exemplary operation of the comparator of FIG. 4.

Referring to FIG. 4, the comparator 130 may include a first comparator 131 and a second comparator 133. The first comparator 131 compares the hold voltage signal VHOLD with the reference voltage signal VREF in response to a first clock signal CLK to generate a first comparison output voltage signal COMPO_R. The second comparator 133 compares the hold voltage signal VHOLD with the reference voltage signal VREF in response to a second clock signal CLKB having a phase opposite to a phase of the first clock signal CLK to generate a second comparison output voltage signal COMPO_F.

Referring to FIG. 5, the first comparison output voltage signal COMPO_R is enabled at a rising edge of the first clock signal CLK, and the second comparison output voltage signal COMPO_F is enabled at a rising edge of the second clock signal CLKB. Therefore, the comparator 130 operates at the rising edge and falling edge of the first clock signal CLK, and generates the comparison output voltage signals COMPO_R and COMPO_F.

The comparison output voltage signal COMPO in FIG. 1 is a signal that a pulse train COUT1, COUT3, COUT5 and COUT7 of the first comparison output voltage signal COMPO_R and a pulse train COUT2, COUT4, COUT6 and COUT8 of the second comparison output voltage signal COMPO_F are added alternately. For example, the comparison output voltage signal COMPO may consecutively include a part of the first comparison signal COMPO_R between times COUT1 and COUT2, a part of the second comparison signal COMPO_F between times COUT2 and COUT3, a part of the first comparison signal COMPO_R between times COUT3 and COUT4, etc.

Figure 6:
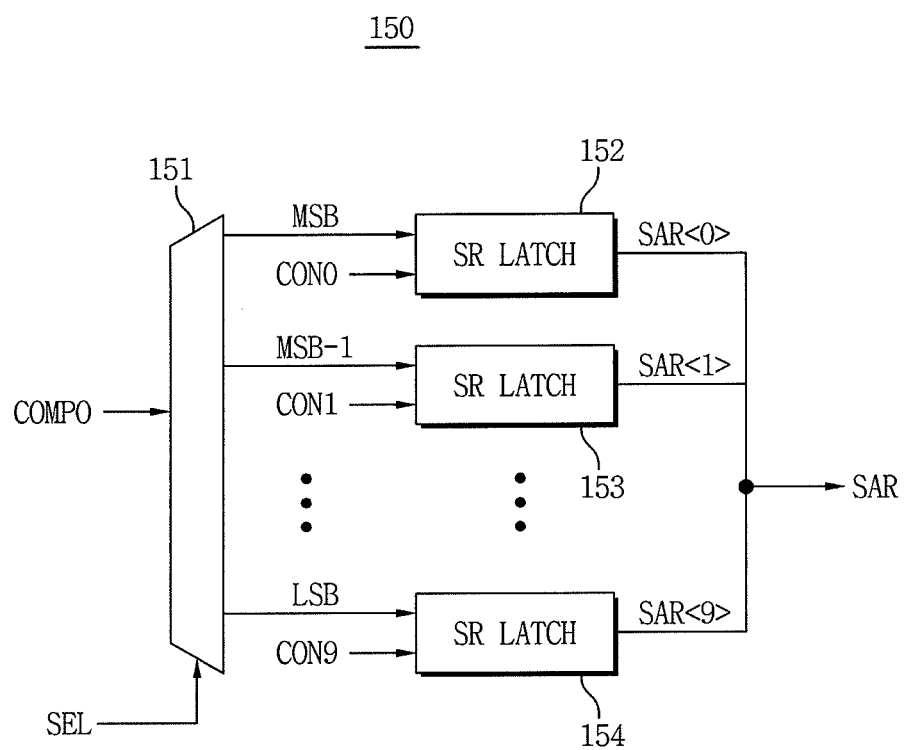
FIG. 6 is a circuit diagram illustrating an example of a signal processing circuit included in the analog to digital converter of FIG. 1.

FIG. 6 is a circuit diagram illustrating an example of a signal processing circuit 150 included in the analog to digital converter 100 of FIG. 1. Referring to FIG. 6, the signal processing circuit 150 may include a demultiplexer 151 and SR latches 152, 153 and 154.

The demultiplexer 151 performs demultiplexing on the comparison output voltage signal COMPO in response to a selecting signal SEL. The SR latches 152, 153 and 154 latch and output one of output signals MSB, MSB−1, ..., LSB of the demultiplexer 151 in response to each bit of a conversion control signal CON<0:9>.

In an analog to digital converter including two comparators 131 and 133 as shown in FIG. 4, two of the signal processing circuit 150 of FIG. 6 may be needed. For example, when two signal processing circuits 150 are used, the outputs of two demultiplexers are alternately output.

When the signal processing circuit 150 of FIG. 6 including the demultiplexer 151 and the SR latches 152, 153 and 154 is employed to generate the digital output data SAR<0:9>, the complexity of a clock timing and a circuit structure may be reduced as compared to when conventional D-type flip-flops are employed.

Outputs of the SR latches 152, 153 and 154 are reset to 000 ... 0 during an input sampling period and have states capable of sampling. The outputs of the SR latches 152, 153 and 154 are initialized and set to 1000 ... 0 just before the comparator 130 operates, and this value is transmitted to the digital to analog converting circuit 110. The comparator 130 determines whether a difference between an input signal and a reference voltage is positive or negative. When a comparing operation is started and the comparator 130 compares a signal corresponding to the MSB, the demultiplexer 151 connects an output of the comparator 130 to an SR latch corresponding to the MSB, and stores the compared result to the SR latch. At the same time, an SR latch corresponding to a second significant bit is initialized to "1" for a next operation, and a value of the SR latch is set to D100 ... 0. Here, D denotes a determined result of the MSB. This operation is continued and a last significant bit (LSB) is output. In the analog to digital converter including two comparators, outputs of the two comparators are applied to each of the demultiplexers, and outputs of each of the comparators may be output in alternate order.

Figure 7:
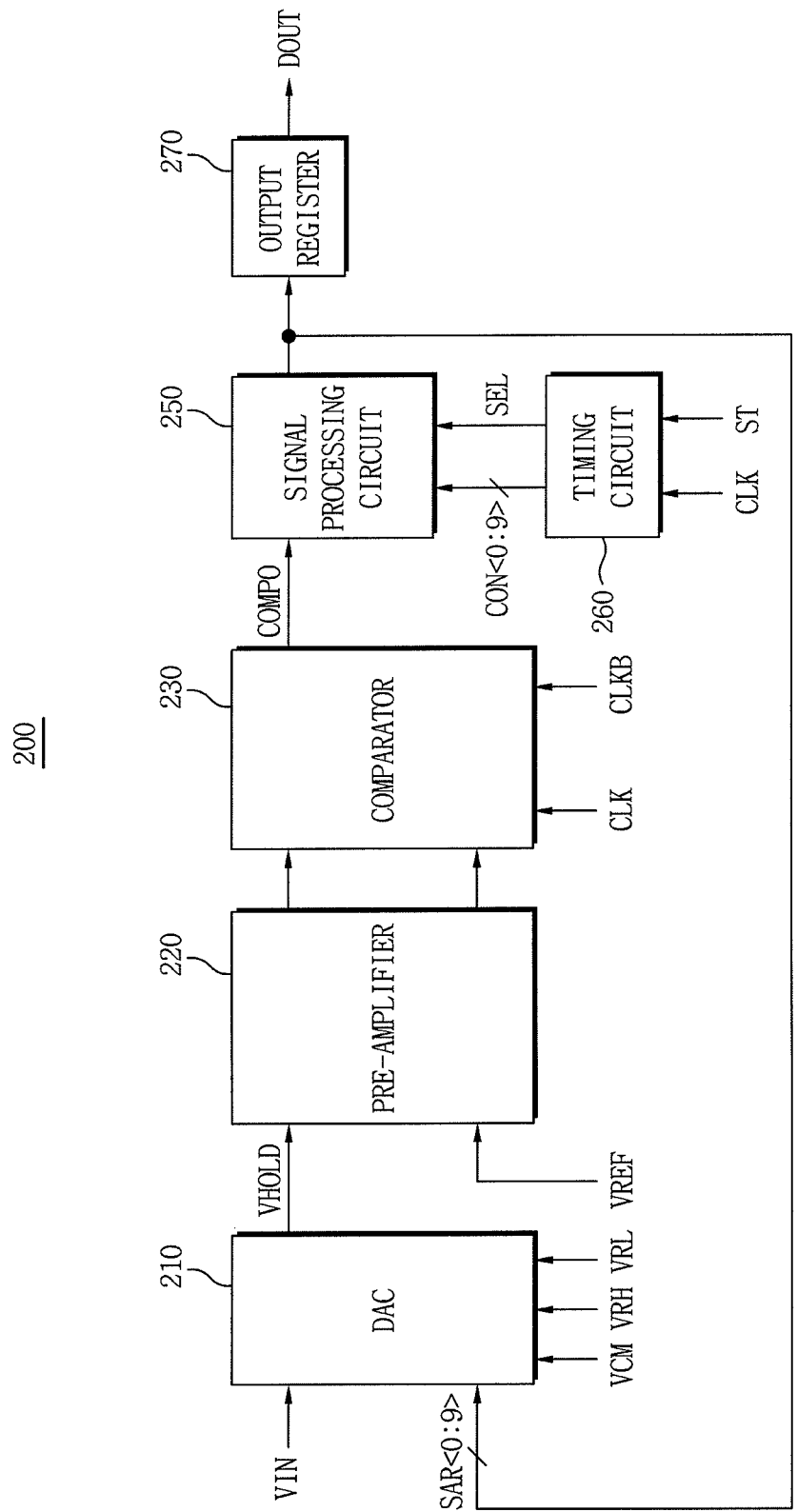
FIG. 7 is a block diagram illustrating an analog to digital converter in accordance with an exemplary embodiment of the inventive concept.

FIG. 7 is a block diagram illustrating an analog to digital converter 200 in accordance with an embodiment of the inventive concept. Referring to FIG. 7, the analog to digital converter 200 includes a digital to analog converting circuit 210, a preamplifier 220, a comparator 230 and a signal processing circuit 250.

The digital to analog converting circuit 210 samples and holds an analog input signal VIN, and converts digital output data SAR<0:9> to an analog signal to generate a hold voltage signal VHOLD. The preamplifier 220 amplifies a difference between the hold voltage signal VHOLD and a reference voltage signal VREF. The comparator 230 compares differential output voltage signals of the preamplifier 220 with each other in response to a rising edge and a falling edge of a clock signal CLK to generate a comparison output voltage signal COMPO. The signal processing circuit 250 performs successive approximation based on the comparison output voltage signal COMPO to generate the digital output data SAR<0:9>.

Further, the analog to digital converter 200 may include a timing circuit 260 and an output register 270. The timing circuit 260 generates a conversion control signal CON<0:9> based on the clock signal CLK and a conversion start signal ST, and provides the conversion control signal CON<0:9> to the signal processing circuit 250. The output register 270 stores the digital output data SAR<0:9>, and outputs the digital output data SAR<0:9> as output data when data is determined by the signal processing circuit 250.

Figure 8:
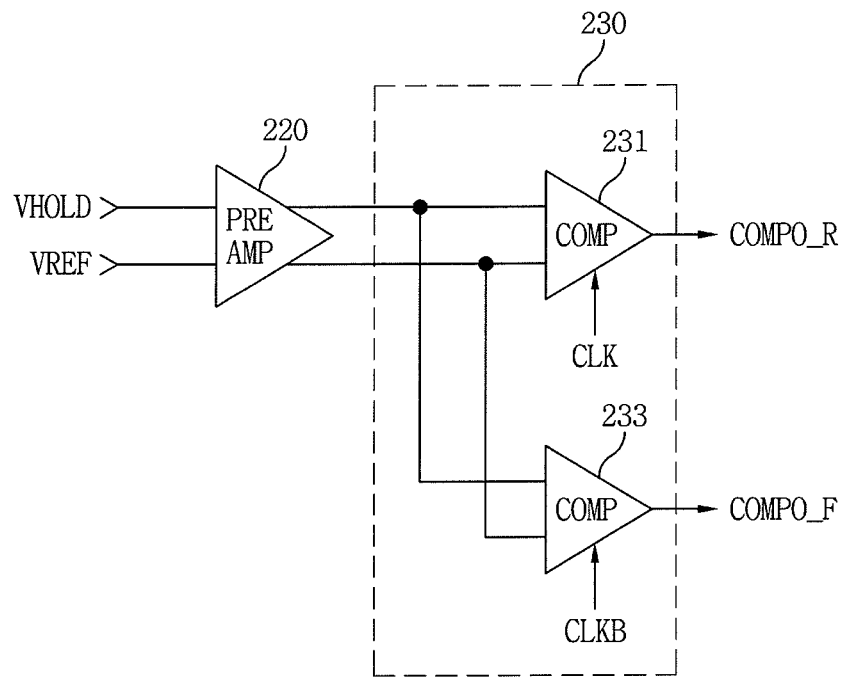
FIG. 8 is a circuit diagram illustrating an example of a preamplifier and a comparator included in the analog to digital converter of FIG. 7.
Figure 9:
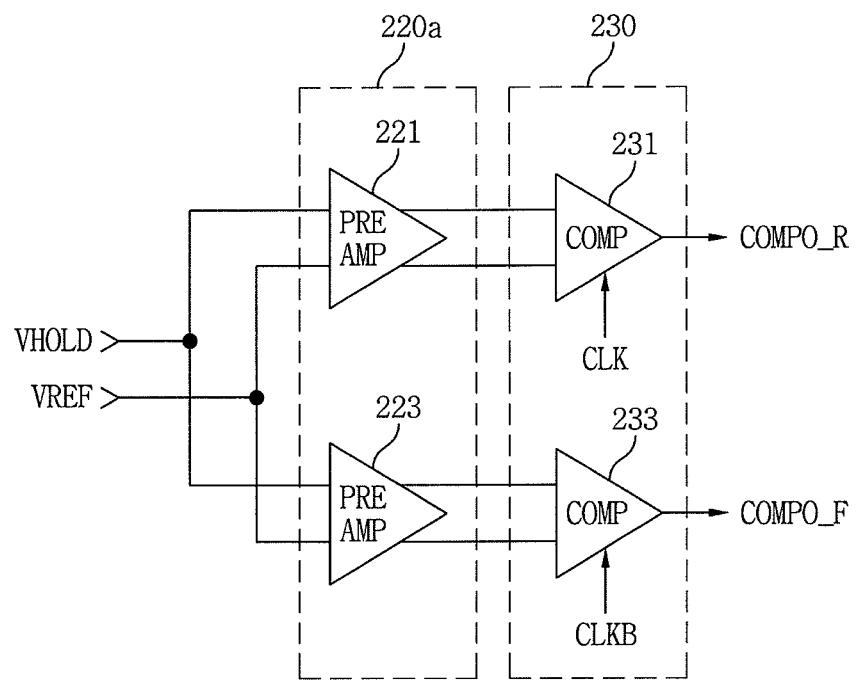
FIG. 9 is a circuit diagram illustrating an example of a preamplifier and a comparator included in the analog to digital converter of FIG. 7.

FIGS. 8 and 9 are circuit diagrams illustrating examples of a preamplifier 220/220A and a comparator 230 included in the analog to digital converter of FIG. 7. Referring to FIG. 8, the preamplifier 220 includes one amplifier that amplifies a difference between the hold voltage signal VHOLD and the reference voltage signal VREF. The comparator 230 includes a first comparator 231 and a second comparator 233.

The first comparator 231 compares the hold voltage signal VHOLD with the reference voltage signal VREF in response to a first clock signal CLK to generate a first comparison output voltage signal COMPO_R. The second comparator 233 compares the hold voltage signal VHOLD with the reference voltage signal VREF in response to a second clock signal CLKB having a phase opposite to a phase of the first clock signal CLK to generate a second comparison output voltage signal COMPO_F.

Referring to FIG. 9, the preamplifier 220a includes a first preamplifier 221 and the second preamplifier 223 that amplify a difference between the hold voltage signal VHOLD and a reference voltage signal VREF. The comparator 230 includes a first comparator 231 and a second comparator 233. The first comparator 231 and the second comparator 233 shown in FIG. 9 may operate in the same way as the comparators shown in FIG. 8.

When two preamplifiers 221 and 223 are employed as shown in FIG. 9, the interference that an offset voltage has on an output node of the analog to digital converter 200 may be decreased.

When the preamplifier 220 is employed in the analog to digital converter 200, the influence that a coupling by a clock signal or a glitch noise has on an output node of the analog to digital converter 200 may be decreased. Further, the preamplifier 220 has a function that decreases an offset voltage of the comparator 230.

When a gain of the preamplifier 220 is A_PRE, an offset voltage of the preamplifier 220 is VOFF_PRE, an offset voltage of the comparator 230 is VOFF_COMP, and a total offset voltage VOFF_IN of the comparator 230 and the preamplifier 220 seen from the output node of the digital to analog converting circuit 210 may be expressed by Expression 1 as follows.

$$\text{VOFF\_IN} = \sqrt{\text{VOFF\_PRE}^2 + \left(\frac{\text{VOFF\_COMP}}{\text{A\_PRE}}\right)^2} \quad \text{Expression 1}$$

As noted from Expression 1, when the preamplifier 220 is employed in the analog to digital converter 200, a magnitude of a total offset voltage VOFF_IN of the comparator 230 and the preamplifier 220 seen from the output node of the digital to analog converting circuit 210 may be decreased.

Figure 10:
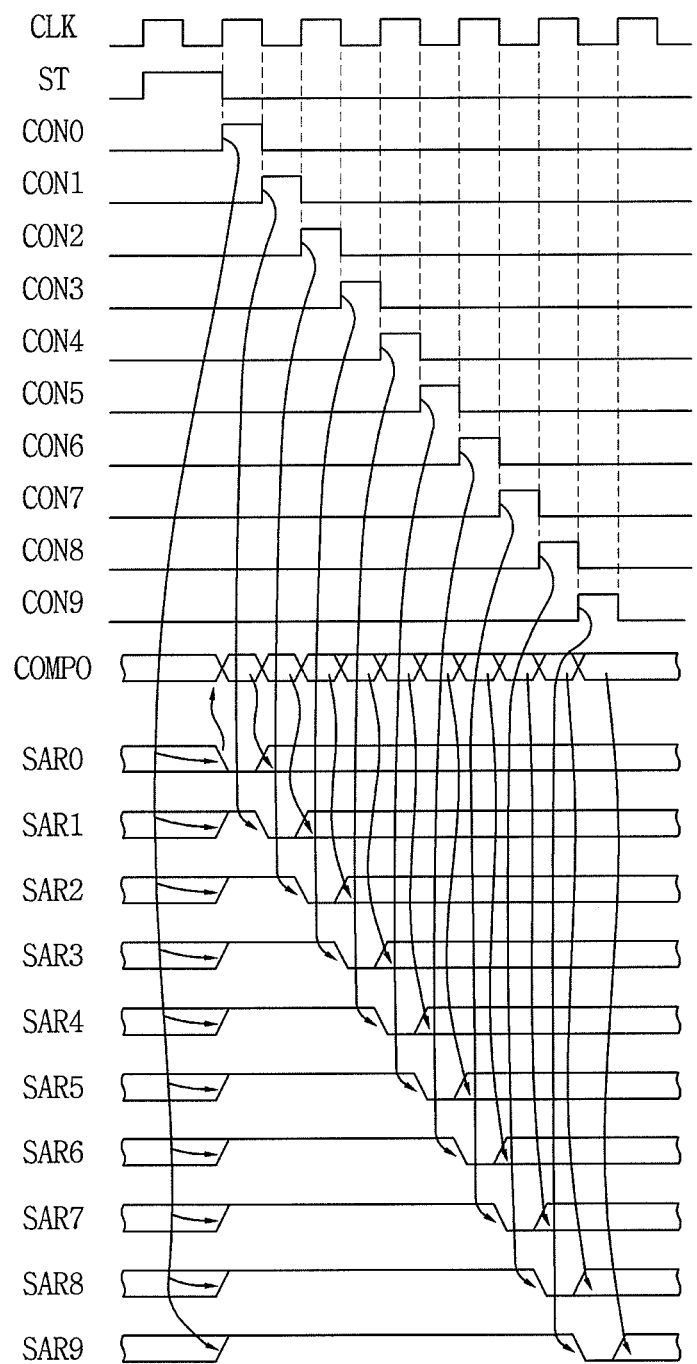
FIG. 10 is a timing diagram illustrating an exemplary operation of the analog to digital converter of FIG. 7.

FIG. 10 is a timing diagram illustrating an exemplary operation of the analog to digital converter 200 of FIG. 7. Referring to FIG. 10, the timing circuit 260 operates in response to the conversion start signal ST, and the analog to digital converter 200 starts a converting operation. As shown in FIG. 10, each bit of the conversion control signal CON<0:9> may be generated (enabled) at a rising edge or a falling edge of the clock signal CLK.

SR latches included in the signal processing circuit 250 are enabled in response to a rising edge of the conversion control signal CON<0:9>, and latch the comparison output voltage signal COMPO that is an output signal of the comparator 230 to generate the digital output data SAR<0:9>.

As mentioned above, the analog to digital converters 100 and 200 perform a comparing operation in response to a rising edge and a falling edge of the clock signal. Therefore, data output speed of the analog to digital converters 100 and 200 may be two times faster than an analog to digital converter performing a comparing operation in response to one edge of the clock signal, without increasing the speed of the clock signal.

Figure 11:
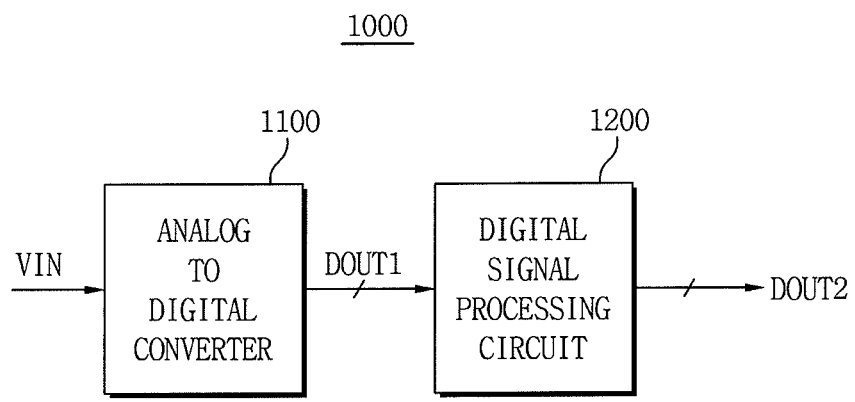
FIG. 11 is a block diagram illustrating a semiconductor device including an analog to digital converter shown in FIG. 1 or FIG. 7 in accordance with exemplary embodiments of the inventive concept.

FIG. 11 is a block diagram illustrating a semiconductor device 1000 including an analog to digital converter shown in FIG. 1 or FIG. 7 in accordance with exemplary embodiments of the inventive concept.

Referring to FIG. 11, the semiconductor device 1000 includes an analog to digital converter 1100 and a digital signal processing circuit 1200. The analog to digital converter 1100 converts an analog input signal VIN to a digital signal to generate a first digital output data DOUT1. The digital signal processing circuit 1200 performs digital signal processing on the digital output data DOUT1 to generate a second digital output data DOUT2. The analog to digital converter 1100 may be one of the analog to digital converters shown in FIG. 1 or 7. The analog to digital converter 1100 may include a digital to analog converting circuit 110, a comparator 130 and a signal processing circuit 150. The digital to analog converting circuit 110 samples and holds the analog input signal VIN, and converts the digital output data SAR<0:9> to an analog signal to generate a hold voltage signal VHOLD. The first digital output data DOUT1 may correspond to the digital output data SAR<0:9> shown in FIG. 1. The comparator 130 compares the hold voltage signal VHOLD with a reference voltage signal VREF in response to a rising edge and a falling edge of a clock signal CLK to generate a comparison output voltage signal COMPO. Further, the comparator 130 may compare two hold voltage signals with each other in response to the rising edge and the falling edge of the clock signal CLK to generate the comparison output voltage signal COMPO. The signal processing circuit 150 performs successive approximation based on the comparison output voltage signal COMPO to generate the digital output data SAR<0:9>.

The analog to digital converter 1100 may include the preamplifier 220 that amplifies a difference between the hold voltage signal VHOLD and the reference voltage signal VREF to provide the amplified signal to the comparator 130.

Figure 12:
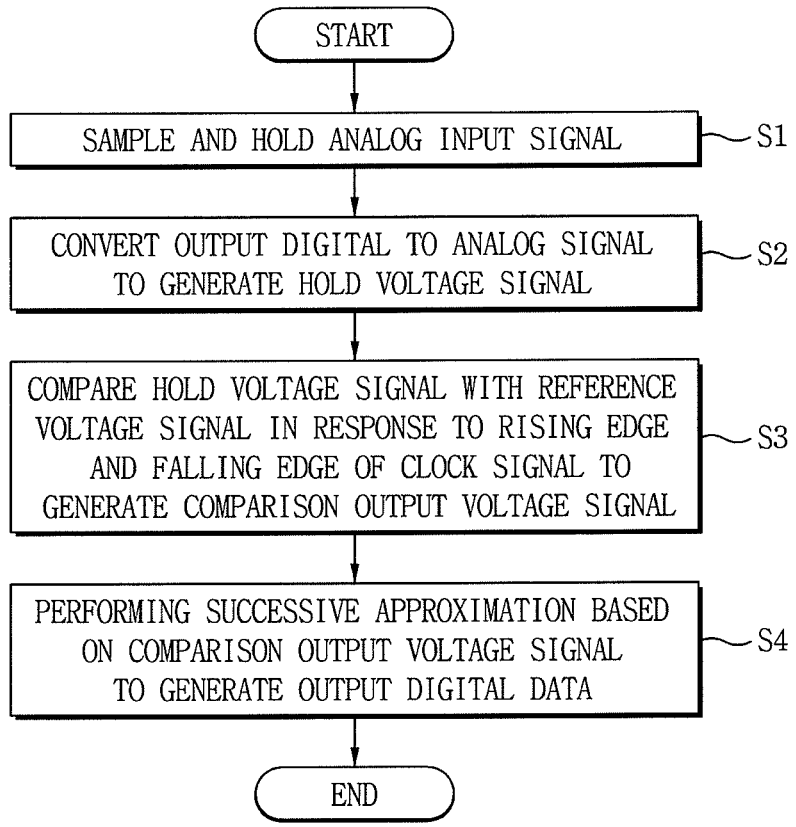
FIG. 12 is a flowchart illustrating a method of analog to digital conversion in accordance with an exemplary embodiment of the inventive concept.

FIG. 12 is a flowchart illustrating a method of analog to digital conversion in accordance with an exemplary embodiment of the inventive concept. Referring to FIG. 12, the method includes sampling and holding an analog input signal (S1), converting digital output data to an analog signal to generate a hold voltage signal (VHOLD) (S2), comparing the hold voltage signal with a reference voltage signal in response to a rising edge and a falling edge of a clock signal to generate a comparison output voltage signal (S3), and performing successive approximation based on the comparison output voltage signal to generate the digital output data (S4).

The method may apply to an asynchronous analog to digital converter as well as to a synchronous analog to digital converter. Embodiments of the inventive concept may apply to an analog to digital converter that performs analog to digital conversion using successive-approximation and a semiconductor device having the same.

While exemplary embodiments of the inventive concept have been described herein, it should be understood that other modifications are possible without materially departing from the scope of the disclosure. Accordingly, all such modifications are intended to be included within the scope of the inventive concept.

What is claimed is:

1. An analog to digital converter, comprising:
   a digital to analog converting circuit configured to sample and hold an analog input signal, and convert digital output data to an analog signal to generate a hold voltage signal;
   a comparator configured to compare the hold voltage signal with a reference voltage signal in response to a rising edge and a falling edge of a clock signal to generate a comparison output voltage signal; and
   a signal processing circuit configured to perform successive approximation based on the comparison output voltage signal to generate the digital output data,
   wherein the signal processing circuit comprises:
   a demultiplexer configured to perform demultiplexing on the comparison output voltage signal in response to a selecting signal; and
   a plurality of SR latches configured to latch and output one of a plurality of output signals of the demultiplexer in response to each bit of a conversion control signal.

2. The analog to digital converter of claim 1, wherein the comparator comprises:
   a first comparator configured to compare the hold voltage signal with the reference voltage signal in response to a first clock signal to generate a first comparison output voltage signal; and
   a second comparator configured to compare the hold voltage signal with the reference voltage signal in response to a second clock signal having a phase opposite to a phase of the first clock signal to generate a second comparison output voltage signal.

3. The analog to digital converter of claim 2, wherein the comparison output voltage signal is a signal in which the first comparison output voltage signal and the second comparison output voltage signal are added alternately.

4. The analog to digital converter of claim 1, further comprising:
   an output register configured to store the digital output data, and output the digital output data when the signal processing circuit determines that the data is to be output.

5. The analog to digital converter of claim 1, further comprising:
   a timing circuit configured to generate a conversion control signal based on the clock signal and a conversion start signal, and provide the conversion control signal to the signal processing circuit.

6. The analog to digital converter of claim 1, wherein the digital to analog converting circuit is a binary-weighted-capacitor-type digital to analog converting circuit.

7. The analog to digital converter of claim 1, wherein the analog to digital converter is a synchronous analog to digital converter.

8. The analog to digital converter of claim 1, wherein the analog to digital converter is an asynchronous analog to digital converter.

9. An analog to digital converter, comprising:
   a digital to analog converting circuit configured to sample and hold an analog input signal, and convert digital output data to an analog signal to generate a hold voltage signal;
   a preamplifier configured to amplify a difference between the hold voltage signal and a reference voltage signal;
   a comparator configured to compare differential output voltage signals of the preamplifier with each other in response to a rising edge and a falling edge of a clock signal to generate a comparison output voltage signal; and a signal processing circuit configured to perform successive approximation based on the comparison output voltage signal to generate the digital output data, wherein the signal processing circuit comprises:

a demultiplexer configured to perform demultiplexing on the comparison output voltage signal in response to a selecting signal; and plurality of SR latches configured to latch and output one of a plurality of output signals of the demultiplexer in response to each bit of a conversion control signal.

10. The analog to digital converter of claim 9, wherein the comparator comprises:

a first comparator configured to compare the differential output voltage signals of the preamplifier with each other in response to a first clock signal to generate a first comparison output voltage signal; and a second comparator configured to compare the differential output voltage signals of the preamplifier with each other in response to a second clock signal having a phase opposite to a phase of the first clock signal to generate a second comparison output voltage signal.

11. The analog to digital converter of claim 9, wherein the preamplifier comprises:

a first preamplifier configured to amplify a difference between the hold voltage signal and a reference voltage signal; and a second preamplifier configured to amplify a difference between the hold voltage signal and a reference voltage signal.

12. The analog to digital converter of claim 11, wherein the comparator comprises:

a first comparator configured to compare the differential output voltage signals of the first preamplifier with each other in response to a first clock signal to generate a first comparison output voltage signal; and a second comparator configured to compare the differential output voltage signals of the second preamplifier with each other in response to a second clock signal having a phase opposite to a phase of the first clock signal to generate a second comparison output voltage signal.

13. The analog to digital converter of claim 9, wherein the preamplifier is configured to decrease an offset voltage of the comparator.

14. The analog to digital converter of claim 9, wherein the preamplifier is configured to reduce noise of an output terminal of the digital to analog converting circuit.

15. An analog to digital converter, comprising:

a digital to analog converting circuit configured to generate a hold voltage signal based on an analog input signal and digital output data;

a first comparator configured to compare the hold voltage signal with a reference voltage signal in response to a first clock signal to generate a first comparison output voltage signal;

a second comparator configured to compare the hold voltage signal with the reference voltage in response to a second clock signal opposite in phase to the first clock signal to generate a second comparison signal; and a signal processing circuit configured to perform successive approximation based on a comparison output voltage signal output by the comparator to generate the digital output data, wherein the comparison output voltage signal is based on both the first and second comparison output voltage signals, wherein the signal processing circuit comprises:

a demultiplexer configured to perform demultiplexing on the comparison output voltage signal in response to a selecting signal to generate a plurality of demultiplexed signals; and a plurality of SR latches configured to latch a corresponding one of the demultiplexed signals in response to a conversion control signal, wherein each SR latch receives a corresponding one bit of the conversion control signal.

16. The analog to digital converter of claim 15, wherein the first comparison output signal is enabled in response to a falling edge of the first clock signal and disabled in response to a rising edge of the first clock signal, and the second comparison output signal is enabled in response to a falling edge of the second clock signal and disabled in response to a rising edge of the second clock signal.

17. The analog to digital converter of claim 16, wherein the comparison output voltage signal sequentially includes a part of the first comparison output voltage and a part of the second comparison output voltage, wherein the part of the first comparison output voltage is from a first time after a rising edge of a pulse of the first clock signal to a second time before a rising edge of a sequential subsequent pulse of the first clock signal, and wherein the part of the second comparison output voltage is from the second time to a third time after the rising edge of the subsequent pulse.

18. The analog to digital converter of claim 15, wherein a first bit of the conversion control signal is enabled while a first pulse of the first clock signal is enabled, and wherein a second bit of the conversion control signal sequentially subsequent to the first bit is enabled while a second pulse of the first clock signal sequentially subsequent to the first pulse is disabled.

* * * * *